United States Patent
Teifel (10) Patent No.: US 9,311,444 B1
(45) Date of Patent: Apr. 12, 2016

(54) INTEGRATED CIRCUIT TEST-PORT ARCHITECTURE AND METHOD AND APPARATUS OF TEST-PORT GENERATION

(71) Applicant: Sandia Corporation, Albuquerque, NM (US)

(72) Inventor: John Teifel, Albuquerque, NM (US)

(73) Assignee: Sandia Corporation, Albuquerque, NM (US)

(*) Notice: Subject to any disclaimer, the term of this patent is extended or adjusted under 35 U.S.C. 154(b) by 6 days.

(21) Appl. No.: 14/328,379

(22) Filed: Jul. 10, 2014

(51) Int. Cl.
*G06F 17/50* (2006.01)
*G01R 31/28* (2006.01)
*G01R 31/3185* (2006.01)

(52) U.S. Cl.
CPC ........ *G06F 17/5081* (2013.01); *G01R 31/2856* (2013.01); *G01R 31/2894* (2013.01); *G01R 31/318583* (2013.01); *G06F 17/50* (2013.01); *G06F 17/504* (2013.01)

(58) Field of Classification Search
CPC ... G06F 17/5081; G06F 17/50; G06F 17/504; G01R 31/2856; G01R 31/2894; G01R 31/318583
USPC ................. 716/103, 105, 106, 108, 110, 136; 703/14; 714/726, 727, 729, 733
See application file for complete search history.

(56) References Cited

U.S. PATENT DOCUMENTS

| | | | | |
|---|---|---|---|---|
| 5,572,437 A * | 11/1996 | Rostoker | .......... | G01R 31/31704 703/13 |
| 6,012,155 A * | 1/2000 | Beausang | ...... | G01R 31/318583 714/727 |
| 6,463,560 B1 * | 10/2002 | Bhawmik | ........... | G01R 31/3187 714/733 |
| 6,643,810 B2 * | 11/2003 | Whetsel | ......... | G01R 31/318583 714/724 |
| 6,789,212 B1 * | 9/2004 | Klingman | ........... | G06F 11/2242 714/12 |
| 6,961,871 B2 * | 11/2005 | Danialy | ........... | G01R 31/31724 714/30 |
| 7,024,346 B1 * | 4/2006 | Allard | ................. | G06F 17/5036 703/14 |
| 7,178,115 B2 * | 2/2007 | Rajsuman | ...... | G01R 31/318314 716/106 |
| 7,235,999 B2 * | 6/2007 | Goetting | ............ | G01R 31/3167 326/14 |
| 7,386,775 B2 * | 6/2008 | Birmiwa | ........ | G01R 31/318583 714/729 |
| 8,286,112 B2 * | 10/2012 | Miranda | ............. | G06F 17/5031 716/110 |
| 8,522,189 B2 * | 8/2013 | Patil | .................... | G06F 11/2242 716/136 |
| 9,128,154 B2 * | 9/2015 | Cesari | ................. | G01R 31/3177 |
| 2001/0013112 A1 * | 8/2001 | Shoyama | .............. | G06F 17/505 716/103 |
| 2003/0208730 A1 * | 11/2003 | Singhal | ................. | G06F 17/504 716/106 |
| 2004/0078178 A1 * | 4/2004 | Blasi | .................... | G06F 17/5022 703/15 |
| 2004/0128626 A1 * | 7/2004 | Wingren | ............. | G06F 17/5045 716/102 |
| 2004/0148150 A1 * | 7/2004 | Ashar | ................... | G06F 17/504 703/14 |

(Continued)

OTHER PUBLICATIONS

Wichlund, S., "Achieving Design closure in a typical Mixed-Signal ASIC; a Design-For-Test Centric Approach", Electronics, Circuits and Systems, 12 IEEE International Conference, ICES 2005, pp. 1-4.

*Primary Examiner* — Helen Rossoshek
(74) *Attorney, Agent, or Firm* — Martin I. Finston (57) ABSTRACT

A method and apparatus are provided for generating RTL code for a test-port interface of an integrated circuit. In an embodiment, a test-port table is provided as input data. A computer automatically parses the test-port table into data structures and analyzes it to determine input, output, local, and output-enable port names. The computer generates address-detect and test-enable logic constructed from combinational functions. The computer generates one-hot multiplexer logic for at least some of the output ports. The one-hot multiplexer logic for each port is generated so as to enable the port to toggle between data signals and test signals. The computer then completes the generation of the RTL code.

11 Claims, 5 Drawing Sheets

(56) References Cited

U.S. PATENT DOCUMENTS

| | | | |
|---|---|---|---|
| 2004/0216061 A1* | 10/2004 | Floyd | G01R 31/3177 716/136 |
| 2004/0254779 A1* | 12/2004 | Wang | G06F 11/261 703/27 |
| 2005/0015693 A1* | 1/2005 | Anzou | G11C 29/54 714/744 |
| 2005/0022086 A1* | 1/2005 | Kotz | G01R 31/2834 714/742 |
| 2005/0077918 A1* | 4/2005 | Teifel | H03K 19/17736 326/41 |
| 2005/0198601 A1* | 9/2005 | Kuang | G06F 17/5022 716/108 |
| 2005/0273683 A1* | 12/2005 | Cote | G01R 31/318583 714/726 |
| 2006/0085172 A1* | 4/2006 | Wilson | G06F 17/5018 703/2 |
| 2007/0174805 A1* | 7/2007 | Hsu | G06F 17/5022 438/17 |
| 2010/0146338 A1* | 6/2010 | Schalick | G06F 11/3648 714/33 |
| 2011/0242330 A1* | 10/2011 | Petersson | H04N 17/004 348/180 |
| 2012/0173943 A1* | 7/2012 | Cesari | G01R 31/318552 714/731 |
| 2014/0137082 A1* | 5/2014 | Ellis | G06F 11/3688 717/124 |

* cited by examiner

| Address | Test Mode | Test Port Pads | | | | | Internal Signals (to Chip Core) | | | | | |
|---|---|---|---|---|---|---|---|---|---|---|---|---|
| | | tp:tp00 | tp:tp01 | tp:tp02 | tp:tp03 | tp:tp04 | o:scanMode | o:bistMode | o:scanTestEn | o:scanTestIn | o:osc_en | o:psm_en |
| 0-1 | System Mode | i:psm_en | i:osc_en | o:ck_mon | x | a:0 | 0 | 0 | 0 | 0 | x | x |
| 2 | ATPG Test Mode | i:se | i:si | o:so | a:0 | a:1 | 1 | 0 | 0 | 0 | 0 | 0 |
| 3 | Memory Test Mode | i:scanTestEn | i:scanTestIn | o:scanTestOut | a:1 | a:1 | 0 | 1 | x | x | 0 | 0 |

INTEGRATED CIRCUIT TEST-PORT ARCHITECTURE AND METHOD AND APPARATUS OF TEST-PORT GENERATION

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to Design for Test (DFT) integrated circuits (ICs) and to methods and apparatus for the digital design of DFT circuits.

ART BACKGROUND

After the user-functional specification has been created for an integrated circuit, the circuit designer must next transform the user specification into a register-transfer level (RTL) description that specifies the logical design of the IC. More specifically, the RTL declares the registers that synchronize the operation of the IC to the clock cycle, and it specifies the combinational logic that performs the logical functions of the IC. In addition to describing the desired behavior of logical circuits, the RTL specifies the interconnections to inputs and outputs.

In the physical design stage, a logic synthesis tool is typically used to convert the RTL to a gate-level description of the IC. More specifically, the synthesis software, operating on the RTL description, generates a logically equivalent description referred to as a "netlist".

The netlist consists of elementary logic primitives drawn from whatever set of such primitives is available in the pertinent physical integrated circuit technology. Many of the elementary logic primitives may be provided by manufacturers as "cells" belonging to a proprietary cell library.

A typical netlist includes a definition for each occurrence of such an elementary logic primitive. The definition lists the ports (or "pins") that are the connection points to the primitive, and it may also define certain properties of the primitive. The netlist also lists the wires, referred to as "nets," that interconnect the primitives and other elements of the IC. The netlist associates the nets, by name, to the ports to which they are connected.

Placement and routing tools process the netlist to create a physical layout for the IC.

Application-specific integrated circuits (ASICS) are a class of ICs that have rapidly growing commercial importance. An ASIC is an IC whose design is customized for a particular use. As the demand for ASICs has grown, so has their complexity. Indeed, a contemporary ASIC may have as many as 100 million gates or more.

Not surprisingly, manufacturers of ASICs must perform post-fabrication testing to screen out parts with manufacturing defects. For effective testing, it is necessary to gain access to internal blocks within the circuit under test (CUT). Absent special provisions, it would be impractical to attempt such access from the primary input-output (I/O) pins of the CUT.

Designers have therefore made a special provision for test access, referred to as a test port. The test port is a combination of logic and I/O pins. A body of techniques, referred to as "Design for Test (DFT)", has evolved for incorporating test-port logic and test-port I/O into ASIC designs, among others. DFT features are typically included in the RTL description of the ASIC.

Standardized test ports, e.g. JTAG1-compatible test ports, are generally available for implementation in commodity IC devices. However, it is more typical to implement proprietary test-port interfaces in custom ASICs. In addition, custom ASICs intended for high-reliability applications often have more stringent test-port usage requirements than those that are typically implemented in commercial test-port IP blocks. Hence these devices in particular will generally implement custom or proprietary test-port interfaces.

The development and implementation of custom or proprietary test-port interfaces has associated costs that could be very high. Because the test port is likely to be highly unique to a particular ASIC design, it will often be necessary to manually develop the hardware source code using an RTL language such as Verilog or VHDL. The effort can be complex, not least because it will in many cases require the multiplexing of hundreds of signals from the logic core.

Moreover, there is often a demand to update the source code late in the ASIC design cycle as the core design is finalized.

These factors drive up costs for various reasons. For example, efforts must be duplicated because the manually developed test-port interfaces are not re-usable across ASIC designs. Moreover, the test-port interfaces are prone to logic bugs, and the test-port interfaces are resource-intensive to generate and validate. Hence, there is a need for a more economical approach for developing and implementing ASIC test-port interfaces.

SUMMARY OF THE INVENTION

We have developed such an approach. More specifically, we have developed a new architecture for a test-port interface, and we have developed an automated method for generating the test-port RTL code from a table specification (also referred to as a spreadsheet specification). The new test-port architecture has special features that facilitate the automated code generation.

Accordingly, the invention in a first aspect relates to a method for generating RTL code for a test-port interface of an integrated circuit. In an embodiment, a test-port table is provided as input data. A computer or other digital data-processing machine acting under a stored set of instructions (hereinafter, "the computer") automatically parses the test-port table into data structures and analyzes it to determine input, output, local, and output-enable port names.

The computer then generates address-detect and test-enable logic constructed from combinational functions. (Combinational functions, also referred to as "static" functions are state free. This distinguishes them from sequential logic circuits, whose output depends not only on the current input, but on the past history of inputs.)

The computer then generates one-hot multiplexer logic for at least some of the output ports. A one-hot multiplexer allows only one input at a time. The one-hot multiplexer logic for each port is generated so as to enable the port to toggle between data signals and test signals.

The computer then completes the generation of the RTL code.

The sequence of steps as listed above is typical but not exclusive. For example, the step of generating address-detect and test-enable logic could, in other implementations, be performed in parallel with the step of generating one-hot multiplexer logic.

In another aspect, the invention relates to a non-transitory, machine-readable medium in which instructions are stored for a computer or other digital data-processing machine to perform the method as described above.

In another aspect, the invention relates to a computer or other digital data-processing machine that has been configured to perform the method as described above. The configuration of the machine for that purpose may be by dedicated circuitry, or by a stored software program, or by a combination of both.

In yet another aspect, the invention relates to an integrated circuit that embodies a test-port interface. The test-port interface includes a logical circuit and a plurality of I/O pins.

The logical circuit is configured to implement a plurality of distinct test-mode blocks. A test-mode block is a logical functionality for configuring and re-mapping core stimulus signals and core observation signals according to the various functions that are to be performed with input and output via the test-port pins. The test-mode blocks are implemented in physical circuitry in the test-port interface.

The test-mode blocks are multiplexed so as to share a group of bidirectional test-port pins for input and for output. For output, the outputs of the respective test-mode blocks are merged in a one-hot multiplexer, which enables the output from only one test-mode block at a time.

A subset of the test-port pins are configured as address pins. When they are suitably energized, the address pins control which test mode block is enabled. The logical circuit is configured such that only one test-mode block can be enabled at a time. Each test-mode block includes an address-detect and test-enable circuit that reads the address pins and in response conditionally enables its test-mode block, i.e. enables the block when it reads an appropriate address.

Each test-mode block is configured to monitor a specifiable number of core observation signals and to drive a specifiable number of core stimulus signals.

Each test-mode block is configured to read and to drive each of the bidirectional test-port pins, and to remap the bidirectional test-port pins among the I/O types input, output, tristate, and bidirectional. As will be known to those skilled in the art, a tristate pad is a pad that can drive a low voltage (logic-0), a high voltage (logic-1), or no voltage (floating output).

DESCRIPTION OF THE TABLES

Table 1 is an example of a table-generated RTL file for a test port, written in the Verilog language. As noted above, this RTL file was generated from the table of FIG. 3.

Table 2 is an example of an ASIC pad table. The pad table is used by the RTL code generator (i.e. the RTL compiler) to analyze the top-level pin requirements for the ASIC and from that to create the RTL file that contains instantiations of the core block and the test-port block.

DETAILED DESCRIPTION

Figure 1:
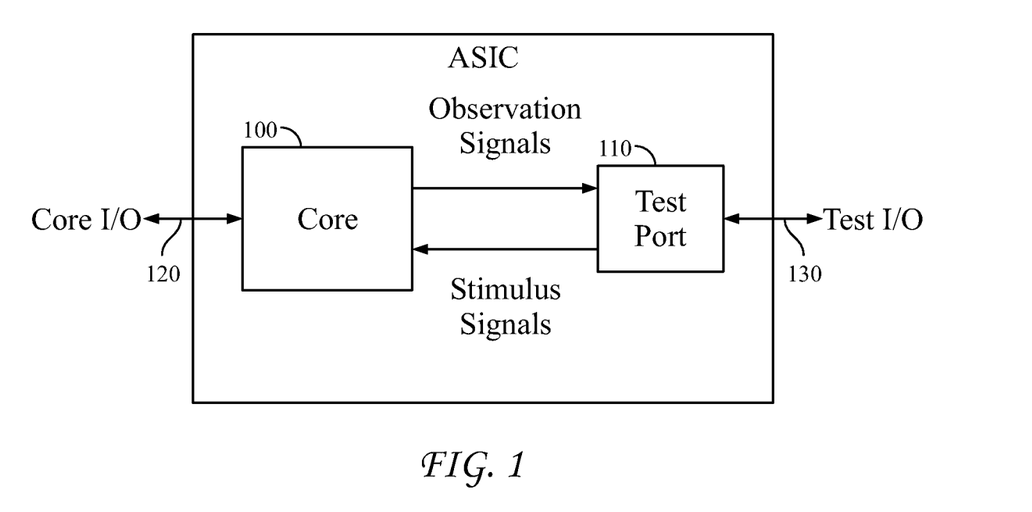
FIG. 1 is a high-level block diagram of a typical ASIC including a core logic block and a test-port block.

FIG. 1 provides a high-level block diagram of a representative ASIC, which includes core logic block 100 and test-port block 110. The application-related functionality of the ASIC is embodied in core 100. The test functionality is embodied in test port 110. The input and output signals pertaining to core functionality ("Core I/O") are symbolically represented by arrow 120 in the figure, and the input and output signals pertaining to test-port functionality ("Test I/O") are symbolically represented by arrow 130.

In our new test-port architecture, a plurality of ASIC test functions share a limited number of bidirectional I/O (input/output) test-pin resources. In implementations, our architecture is efficient, has low overhead, is scalable for small and large ASIC designs, and can support an arbitrary number of test signals and test modes.

As will be explained in more detail below, the high-level test-port specification for implementations of our architecture can be concisely defined in a table (also referred to herein as a "spreadsheet"). A compiler is provided that automatically generates the test-port RTL code from the table. Among other things, the RTL code logically defines all of the wires and ports that are needed to implement the test port. Moreover, the generated RTL code is synthesizable to combinational (i.e., static) logic; hence the use of sequential (i.e., state-based) logic can be avoided as is desirable, e.g., for high-reliability systems.

Figure 2:
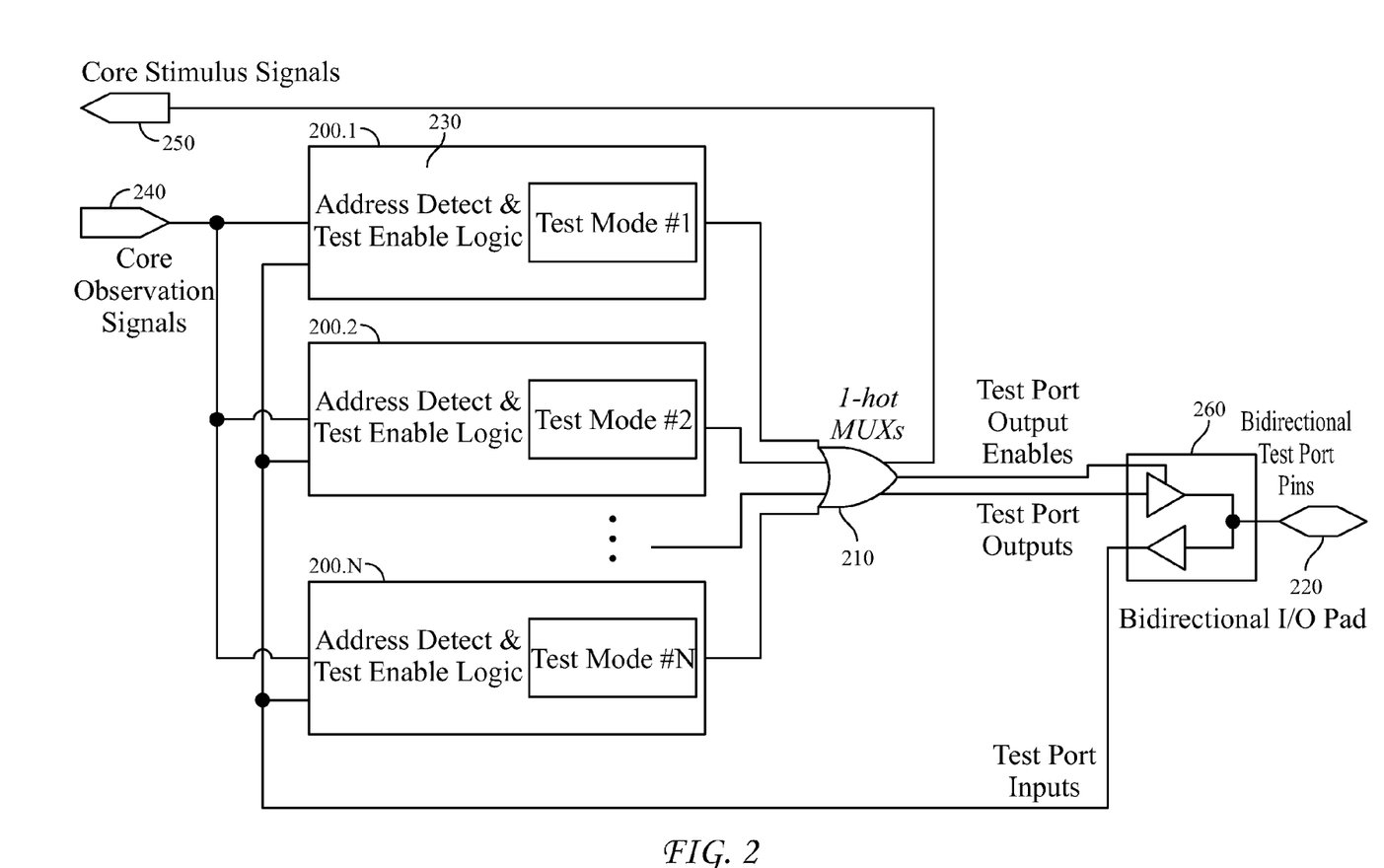
FIG. 2 is a high-level schematic diagram that illustrates a new test-port architecture according to the principles described here. We refer to our new architecture as a table-driven test-port architecture.

FIG. 2 provides a block diagram of our new table-driven test-port architecture. As shown in the figure, an arbitrary number of Test Mode blocks 200.1, 200.2, . . . , 200.N are multiplexed together using, e.g., one-hot multiplexer arrangement 210 so that they share a limited number of bidirectional test-port pins 220. A "one-hot multiplexer" is a multiplexer that enables only one input at a time. Hence one-hot multiplexers are useful in arrangements that permit toggling between, e.g., data signals and test signals, or between test signals of different kinds.

In the specification table, a subset of the test-port pins is defined as the set of address pins. The set of signal values on the respective address pins specifies which Test Mode block is to be enabled at each given time.

During testing, only one Test Mode block is enabled at any given time. The address detect and test enable logic 230 contained within each Test Mode block reads the test-port pins and responds by enabling that Test Mode block if it is the one that has been designated. This property allows efficient one-hot multiplexers, implemented with an N-input OR gate, to be used to merge the outputs of all the Test Mode blocks.

Core observation signals 240, among other, are wiring signals that go from the ASIC core to the test port. Core stimulus signals 250, among others, are wiring signals that go from the test port to the ASIC core. In accordance with definitions provided in the specification table, each Test Mode block can monitor an arbitrary number of core observation signals and can drive an arbitrary number of core stimulus signals.

Likewise, each Test Mode block has access to each bidirectional test-port pin and can re-map the test-port pins as input, output, tristate, or bidirectional I/O types in accordance with definitions provided in the specification table.

As shown in the figure, test-port inputs are broadcast from bidirectional I/O pad 260 to the test-mode blocks. Test-port outputs travel from the respective test-mode blocks to the multiplexer arrangement 210, from which they travel, when enabled, through pad 260 to the designated pins 220.

Figure 3:
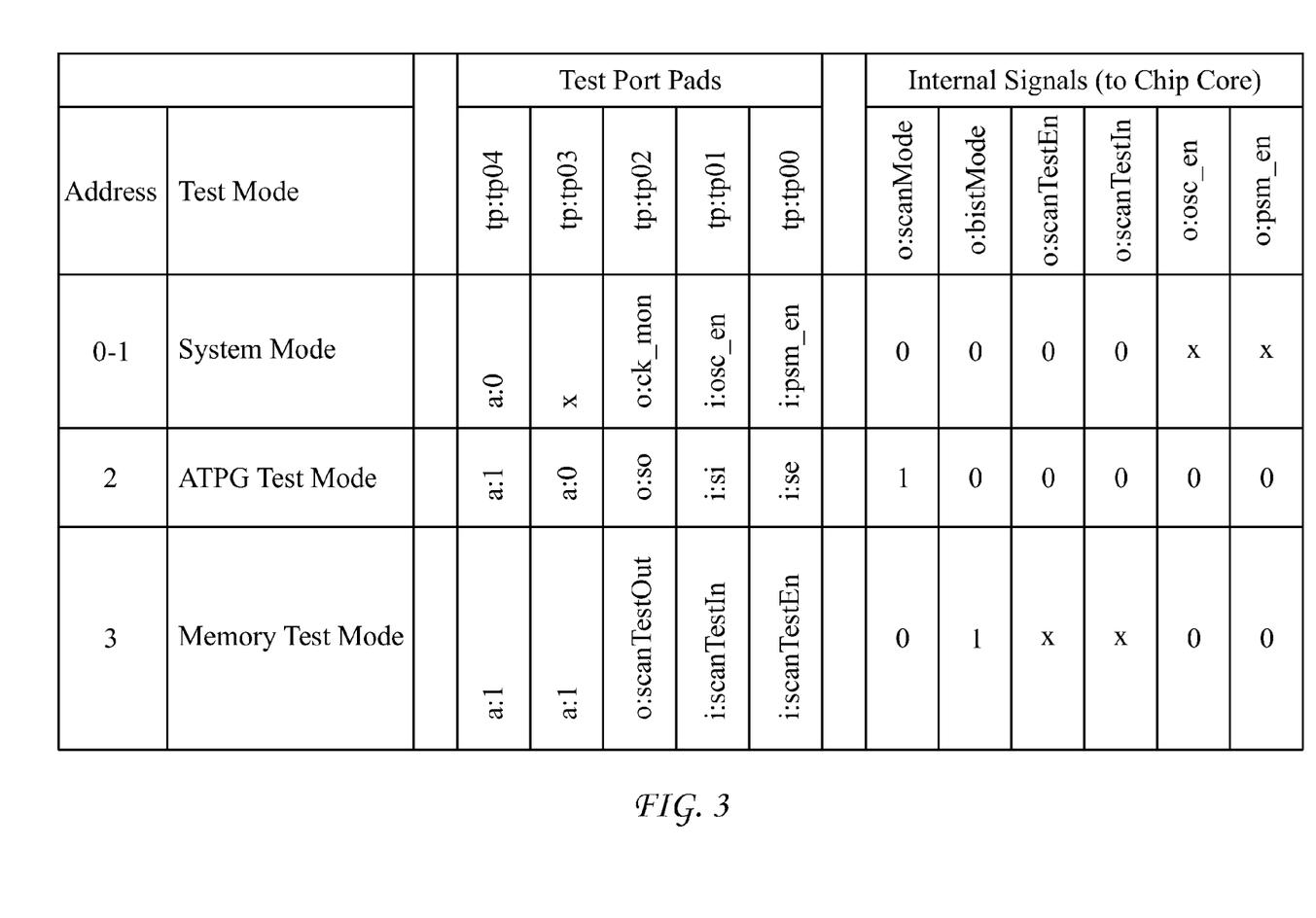
FIG. 3 provides a simplified example of a test-port specification table, also referred to as a "spreadsheet", that provides the input information for generating RTL code that implements the test port according to the principles described here. Table 1, described below, provides an example of RTL code generated from the table of FIG. 3.

FIG. 3 provides a basic example of a test-port specification table (or "spreadsheet"). The specification table of FIG. 3 is highly simplified and is intended as an illustration purely for pedagogical purposes. It will be understood that in practice, the table for a typical ASIC test port will contain hundreds or even thousands of entries.

With further reference to FIG. 3, it will be seen that the left-most vertical column is labeled with the header "Address" and the vertical column immediately to its right, i.e. the second column, is labeled with the header "Test Mode". The entries in these columns are for the convenience of human readers and are not read by the compiler, i.e. by the RTL generation apparatus.

The next five columns, i.e. the columns under the header "Test Port Pads", list the respective values on the five (in this example) test-port pins, which as seen in the header row are respectively indexed tp00, tp01, tp02, tp03, and tp04. It will be seen that each row of the table (following the header rows) corresponds to one of three test modes, which are respectively System Mode, ATPG Test Mode, and Memory Test Mode. The set of five test-port pins takes on a respective 5-tuple of values for each of the three test modes. These values are discussed below. A value of "x" in the Test Port Pads columns signifies "don't care".

The last six columns of the table, i.e. the columns under the header "Internal Signals (to chip core)", define the values of internal signals that go from the test port to the ASIC core. As seen in the table, each of the signals is defined with the "o:name" syntax. This indicates that they are all stimulus signals. In more general cases, some of the internal signals, which would be defined with the "l:name" syntax, are local wires rather than stimulus signals.

The possible internal signal values are 1, 0, and x. A value of "x" in the Internal Signals columns signifies that the pertinent signal will take the value defined by one of the test-port pads. For example, "x" is listed as the internal signal value at address 0-1, internal signal o:osc_en. This signifies that the osc:en stimulus signal will take the value driven on the tp01 test-port pad, because it has "i:osc_en" defined for the relevant test mode.

The respective internal signals identified in the header row are "Scan Mode", "Built-In Self-Test (BIST) Mode", "Scan Test Enable", "Scan Test Input", "Oscillator Enable", and "PSM Enable". Output variables used in only one place in the spreadsheet are implicitly inferred and need not be explicitly declared in the header row. It will be seen that the set of six internal-signal ports takes on a respective 6-tuple of values for each of the three test modes. These values are discussed below.

Observation signals, which as noted are among the wiring signals that go from the ASIC core to the test port, do not need to be declared. They are implicitly inferred from their usage in the spreadsheet. However, local wires inside of the test port, such as output-enable control signals for the test-port pins that are controlled by other test-port pin inputs, should be declared in the header row with, e.g., a "l:name" syntax.

Other syntax for the spreadsheet is described below:
"a:0" and "a:1" tokens define addresses or modes of operation; the addresses/modes need to be uniquely defined or else undefined behavior will result.
"x" tokens define "don't care" inputs.
"0" and "1" tokens define output values to the ASIC core.
"i:name" tokens define name as a variable received as an input on a test-port pin.
"o:name" tokens define name as an output variable to a test-port pin; 0/1 are allowable names for constant output values.
"t:out,oe" tokens define out as a tristate output variable to a test-port pin, with oe as the output enable.
"b:in,out,oe" tokens define a bidirectional test-port pin, with in as the input variable, out as the output variable, and oe as pad output enable.
"se:num" tokens define logic scan-chain enable inputs, with num identifying the scan enable index.
"si:num" tokens define logic scan-chain inputs, with num identifying the scan input index.
"so:num" tokens define logic scan-chain outputs, with num identifying the scan output index.

Accordingly, it will be seen that in the example of FIG. 3, the address pins are test-port pins 04 and 03, which respectively take the values (0, x) in System Mode, (1, 0) in ATPG Test Mode, and (1, 1) in Memory Test Mode.

"ATPG" stands for "Automatic Test Pattern Generation." ATPG Test Mode enables the internal logic scan chains and allows the design to be tested with ATPG vectors.

Memory Test Mode enables the internal memory scan chains and allows the internal memories to be tested.

In System Mode, test-port pins 02, 01, and 00 respectively carry the clock monitor output signal, the oscillator enable input signal, and the Power-Supply Monitor (PSM) enable input signal. In ATPG Test Mode, they respectively carry the oscillator output signal, the scan-chain input signal, and the scan-chain-enable input signal. In Memory Test Mode they respectively carry the internal (i.e. to or from the chip core) scan-test output, input, and enable signals.

As noted above, the respective internal signals identified in the example of FIG. 3 are "Scan Mode", "Built-In Self-Test (BIST) Mode", "Scan Test Enable", "Oscillator Enable", and "PSM Enable". In System Mode, the first four of these take the value 0 and the last two are "don't care". In ATPG Test Mode, the Scan Mode signal takes the value 1 and the rest are 0. In Memory Test Mode, the Built-In Self-Test Mode signal takes the value 1, the Scan Test Enable and Scan Test Input signals are "don't care", and the rest take the value 0.

Figure 4:
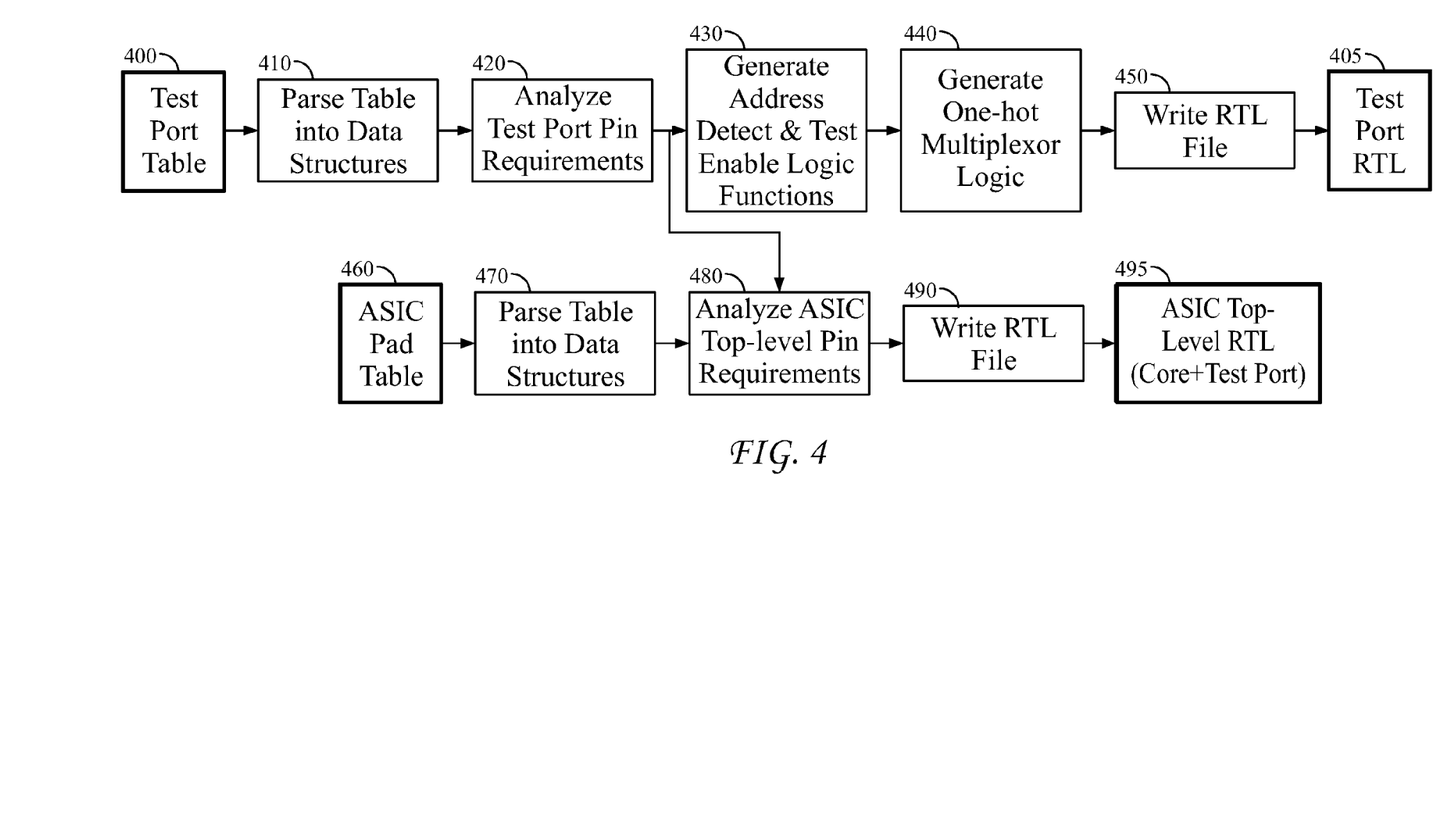
FIG. 4 is a flow diagram illustrating the generation of RTL code from the test-port specification table according to the principles described here. As illustrated in the figure, RTL code is generated for the test port and for the top-level module in the RTL code for the ASIC, including both the core and the test port.

FIG. 4 illustrates the compiler algorithm that generates RTL code 405 from the test-port specification table 400. As seen in the figure: The test-port table is parsed 410 into data structures and analyzed 420 to determine input, output, local, and output enable port names. Then the address-detect and test-enable logic is generated 430 using static (combinational) functions. Then the one-hot multiplexor logic is generated 440 for appropriate output ports. Then the RTL file is written 450. A representative test-port RTL output file, using the Verilog language, is listed in Table 1.

The algorithm described above for generating the test-port RTL file can be implemented as one of two linked phases for specifying the entire ASIC by generating an RTL file that contains instantiations of both the core block and the test-port block. Seen in the lower portion of FIG. 4 is an algorithm for generating the ASIC top-level RTL file that specifies the ASIC of FIG. 1.

ASIC pad table 460 provides input to the algorithm that generates the top-level RTL file. According to that algorithm, the pad table is parsed 470, the ASIC's top-level pin requirements are analyzed 480, and the resulting RTL file 495, containing instantiations of the core block and the test-port block, is written out 490.

As indicated by the arrow drawn in the figure from block 420 to block 480, data flows from the test-port algorithm (i.e. the upper branch of the figure) to the top-level algorithm (i.e., the lower branch of the figure). Specifically, test-port pin names, core stimulus signal names, and core observation signal names are passed from the upper branch to the lower branch. This information is used by the lower branch to hook up the internal signals and wires that go between the core and the test-port block.

A representative ASIC pad table is listed in Table 2.

As those skilled in the art will understand, algorithms for performing the sequence of steps represented in the lower portion of FIG. 4, i.e. the analysis of the ASIC Pad Table and the generation from it of top-level core RTL (without the test-port description) are available for conventional use.

Representative Example

Figure 5:
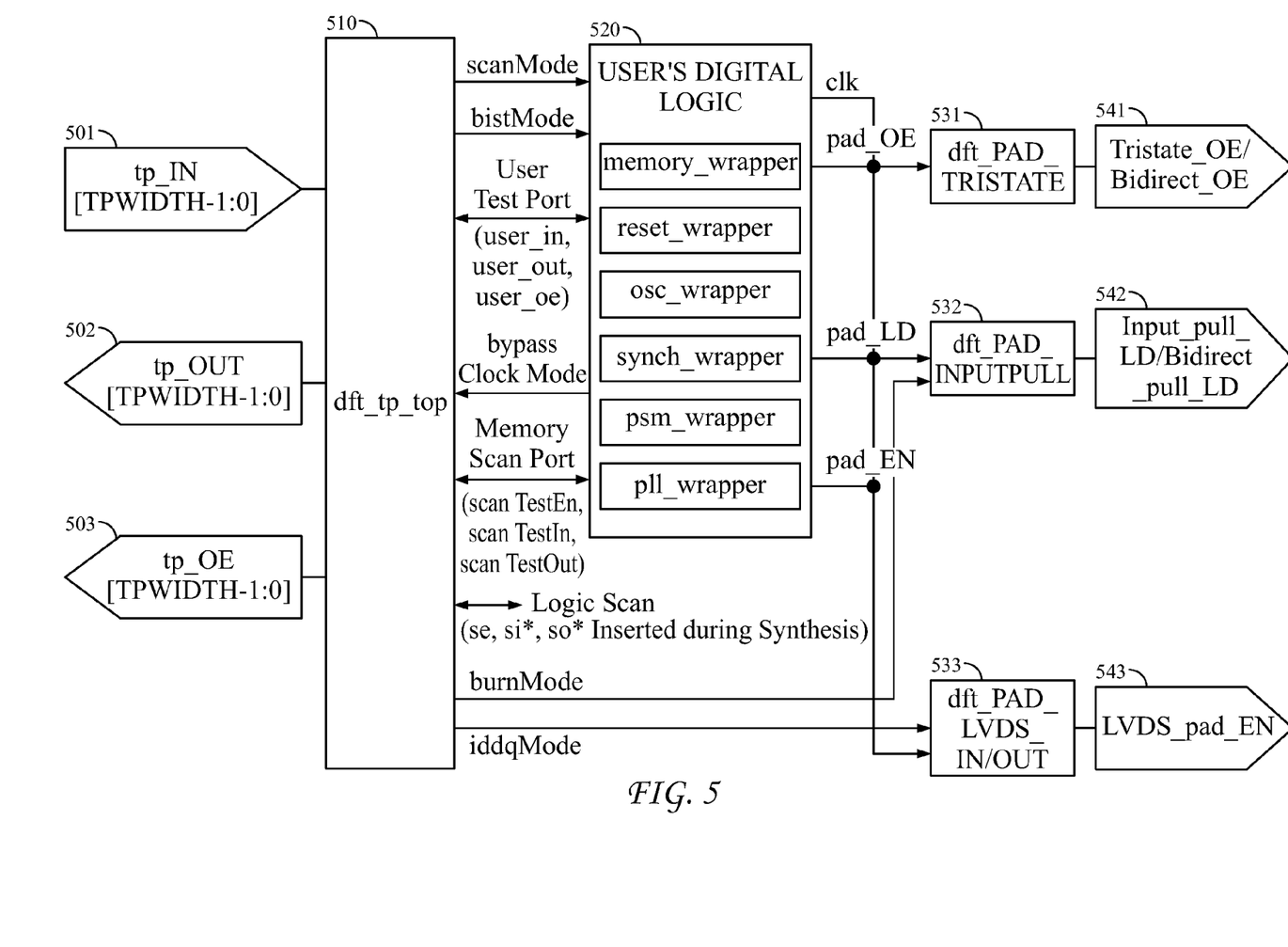
FIG. 5 is a high-level, generic block diagram of a representative ASIC implementation whose architecture embodies DFT techniques. The ASIC of FIG. 5 incorporates test-port logic (denominated "dft_tp_top" in the figure) that can be implemented using the table-driven techniques described here. To avoid confusion, however, it should be noted that the signals represented in the figure do not directly correspond to the signals defined in the table of FIG. 3.

FIG. 5 provides a diagram, simplified for ease of presentation, of an illustrative ASIC design-for-test architecture. The logic for test port 510 of the ASIC can be implemented by the method described here.

With reference to the figure, it will be seen that dedicated test port (tp) bidirectional pins 501-503 are used to configure the ASIC into the various test modes. The test modes represented in the figure include logic scan-chain testing (Logic Scan mode), memory scan-chain testing (Memory Scan mode), and analog block testing (not shown in the figure).

Logic Scan mode uses the scan enable (se) and scan input (si) stimulus signals to apply test patterns to the core from the test-port pins, and it uses the scan output (so) observation signal to observe test results. Memory Scan mode uses the scan enable (scanTestEn) and scan input (scanTestIn) stimulus signals to apply memory test patterns to the core from the test-ports pins, and it uses the scan out (scanTestOut) observation signal to observe test results.

The scanMode signal, represented symbolically in the figure, configures the ASIC into Logic Scan mode. The bistMode signal configures the ASIC into Memory Scan mode. The burnMode signal configures the ASIC pads into Burn-in test mode, in which the ASIC is exposed to elevated temperature and voltage to screen for infant mortality manufacturing defects. The iddqMode signal configures the ASIC pads into Quiescent IDD test mode, in which the ASIC is checked for elevated power consumption due to manufacturing defects. The bypassClockMode signal disables internally generated clock sources inside of the ASIC, and instead uses more accurate, externally generated clock sources to test the ASIC. The various test modes listed here are well known to those skilled in the art.

Other test modes include the User Test modes that use the "user_in" stimulus signals to apply test patterns to the core from the test-port pins, and the "user_out" and "user_oe" observation signals to observe test results. The "user_out" observation signals can also be used to passively monitor internal states during normal (non-test) ASIC operation. The User Test mode offers substantial advantages in the context of the flexible test-port architecture described here because an arbitrary number of number of user-defined test modes can be defined in the table specification to adapt to the complexity of any ASIC.

The test-port pins are also used to apply stimulus signals which will be directed from the test port to the ASIC core. As noted above, user_out signals on the test-port pins bring out internal states of the core for observation.

Although a typical ASIC design requires fifteen to thirty test-port pins, approximately 75% of these pins may be recovered for general use by multiplexing them with easy-to-test functions such as analog block enables, power supply monitor outputs, clock and reset monitor outputs, or analog trim settings.

As noted above, Table 1 is an example of an RTL file for a test port generated from the table of FIG. 3. The compiler reads the lines of the table and processes them to generate an RTL output file. The RTL output file assigns logical equations to the respective pins. In the synthesis stage of ASIC design, these logical equations will be realized as logic gates.

All of the information needed to generate the logical equations is provided in the specification table. The coding of a suitable compiler is a straightforward problem in computer programming that is soluble by conventional techniques and need not be described here in detail. By way of example, a compiler can be written in Perl or C++ and be implemented as a standalone program independent of the specification table. Alternatively, VisualBASIC or JAVA can be used to more elegantly integrate the compiler directly into the spreadsheet program used to create the specification table.

In Table 1, rows of the spreadsheet are referenced by the syntax [row number], i.e. [0], [1], or [2]. The logical operations referred to in the figure include the following:

= assign,
== equals,
&& AND (Verilog, e.g., defines this as a logical AND, treating the operands as Boolean values 0 or 1), and
| OR (Verilog, e.g., defines this as a bitwise OR, treating the operands as binary bits, wherein all of the binary bits in the operands are OR'ed together).

Equation types are "out", "in", and "output enable".

As noted above, Table 2 provides an example of an ASIC pad table. The "cell types" referred to in the table, which are named arbitrarily, refer to entries in a cell library. As those skilled in the art will understand, the "cells" collected in a cell library are implementations of logic functions. The logic functions are provided in representations that are usable by automated ASIC design tools for synthesis, placement, and routing.

Table 1: Representative Test Port RTL Output File (Verilog Language)
// WARNING: this file was automatically generated by dft_gen_testport.pl
// Do not change manually
// input: dft_export.txt
// output: dft_testport.v
module dft_testport(
   output se,
   output si,
   output bistMode,
   input clk_mon,
   output osc_en,
   output psm_en,
   output scanMode,
   output scanTestEn,
   output scanTestIn,

```
    input scanTestOut,
    input so,
    input tp00_IN,
    output tp00_OE,
    output tp00_OUT,
    input tp00_IN,
    output tp01_OE,
    output tp00_OUT,
    input tp02_IN,
    output tp02_OE,
    output tp02_OUT,
    input tp03_IN,
    output tp03_OE,
    output tp03_OUT,
    input tp04_IN,
    output tp04_OE,
    output tp04_OUT
);
// local variables
// internal one-hot mux inputs
    wire [2:0] bistMode___;
    wire [2:0] osc_en___;
    wire [2:0] psm_en___;
    wire [2:0] scanMode___;
    wire [2:0] scanTestEn___;
    wire [2:0] scanTestIn___;
    wire [2:0] tp00_OE___;
    wire [2:0] tp00_OUT___;
    wire [2:0] tp01_OE___;
    wire [2:0] tp00_OUT___;
    wire [2:0] tp02_OE___;
    wire [2:0] tp02_OUT___;
    wire [2:0] tp03_OE___;
    wire [2:0] tp03_OUT___;
    wire [2:0] tp04_OE___;
    wire [2:0] tp04_OUT___;
// address-detect (gating) logic
    assign tp04_OUT___[0]=((tp04_IN==0)) && 0;
    assign tp04_OE___[0]=((tp04_IN==0)) && 0;
    assign tp03_OUT___[0]=((tp04_IN==0)) && 0;
    assign tp03_OE___[0]=((tp04_IN==0)) && 0;
    assign tp02_OUT___[0]=((tp04_IN==0)) && clk_mon;
    assign tp02_OE___[0]=((tp04_IN==0)) && 1;
    assign osc_en___[0]=((tp04_IN==0)) && tp00_IN;
    assign tp00_OUT___[0]=((tp04_IN==0)) && 0;
    assign tp01_OE___[0]=((tp04_IN==0)) && 0;
    assign psm_en___[0]=((tp04_IN==0)) && tp00_IN;
    assign tp00_OUT___[0]=((tp04_IN==0)) && 0;
    assign tp00_OE___[0]=((tp04_IN==0)) && 0;
    assign scanMode___[0]=((tp04_IN==0)) && 0;
    assign bistMode___[0]=((tp04_IN==0)) && 0;
    assign scanTestEn___[0]=((tp04_IN==0)) && 0;
    assign scanTestIn___[0]=((tp04_IN==0)) && 0;
    assign tp04_OUT___[1]=((tp04_IN==1)) && 0;
    assign tp04_OE___[1]=((tp04_IN==1)) && 0;
    assign tp03_OUT___[1]=((tp04_IN==1) && (tp03_IN==0)) && 0;
    assign tp03_OE___[1]=((tp04_IN==1) && (tp03_IN==0)) && 0;
    assign tp02_OUT___[1]=((tp04_IN==1) && (tp03_IN==0)) && so;
    assign tp02_OE___[1]=((tp04_IN==1) && (tp03_IN==0)) && 1;
    assign si=((tp04_IN==1) && (tp03_IN==0)) && tp00_IN;
    assign tp00_OUT___[1]=((tp04_IN==1) && (tp03_IN==0)) && 0;
    assign tp01_OE___[1]=((tp04_IN==1) && (tp03_IN==0)) && 0;
    assign se=((tp04_IN==1) && (tp03_IN==0)) && tp00_IN;
    assign tp00_OUT___[1]=((tp04_IN==1) && (tp03_IN==0)) && 0;
    assign tp00_OE___[1]=((tp04_IN==1) && (tp03_IN==0)) && 0;
    assign scanMode___[1]=((tp04_IN==1) && (tp03_IN==0)) && 1;
    assign bistMode___[1]=((tp04_IN==1) && (tp03_IN==0)) && 0;
    assign scanTestEn___[1]=((tp04_IN==1) && (tp03_IN==0)) && 0;
    assign scanTestIn___[1]=((tp04_IN==1) && (tp03_IN==0)) && 0;
    assign osc_en___[1]=((tp04_IN==1) && (tp03_IN==0)) && 0;
    assign psm_en___[1]=((tp04_IN==1) && (tp03_IN==0)) && 0;
    assign tp04_OUT___[2]=((tp04_IN==1)) && 0;
    assign tp04_OE___[2]=((tp04_IN==1)) && 0;
    assign tp03_OUT___[2]=((tp04_IN==1) && (tp03_IN==1)) && 0;
    assign tp03_OE___[2]=((tp04_IN==1) && (tp03_IN==1)) && 0;
    assign tp02_OUT___[2]=((tp04_IN==1) && (tp03_IN==1)) && scanTestOut;
    assign tp02_OE___[2]=((tp04_IN==1) && (tp03_IN==1)) && 1;
    assign scanTestIn___[2]=((tp04_IN==1) && (tp03_IN==1)) && tp00_IN;
    assign tp00_OUT___[2]=((tp04_IN==1) && (tp03_IN==1)) && 0;
    assign tp01_OE___[2]=((tp04_IN==1) && (tp03_IN==1)) && 0;
    assign scanTestEn___[2]=((tp04_IN==1) && (tp03_IN==1)) && tp00_IN;
    assign tp00_OUT___[2]=((tp04_IN==1) && (tp03_IN==1)) && 0;
    assign tp00_OE___[2]=((tp04_IN==1) && (tp03_IN==1)) && 0;
    assign scanMode___[2]=((tp04_IN==1) && (tp03_IN==1)) && 0;
    assign bistMode___[2]=((tp04_IN==1) && (tp03_IN==1)) && 1;
    assign osc_en___[2]=((tp04_IN==1) && (tp03_IN==1)) && 0;
    assign psm_en___[2]=((tp04_IN==1) && (tp03_IN==1)) && 0;
// one-hot mux outputs
    assign bistMode=(|bistMode___);
    assign osc_en=(|osc_en___);
    assign psm_en=(|psm_en___);
    assign scanMode=(|scanMode___);
    assign scanTestEn=(|scanTestEn___);
    assign scanTestIn=(|scanTestIn___);
    assign tp00_OE=(|tp00_OE___);
    assign tp00_OUT=(|tp00_OUT___);
    assign tp01_OE=(|tp01_OE___);
    assign tp00_OUT=(|tp00_OUT___);
    assign tp02_OE=(|tp02_OE___);
    assign tp02_OUT=(|tp02_OUT___);
    assign tp03_OE=(|tp03_OE___);
    assign tp03_OUT=(|tp03_OUT___);
    assign tp04_OE=(|tp04_OE___);
    assign tp04_OUT=(|tp04_OUT___);
endmodule
```

TABLE 2

Representative ASIC Pad Table

| SIGNAL NAME | DIRECTION | CELL TYPE |
| --- | --- | --- |
| my_input | INPUT | PICADEE |
| my_output | OUTPUT | POCAD4SEE |
| my_tristate | TRISTATE | POTAD4SEE |
| my_bidirect | BIDIRECTIONAL | PBSTAD16FEE |
| my_inputpull | INPUTPULL | PISADPDEE |
| my_bidirectpull | BIDIRECTPULL | PBSTADPU4FEE |
| my_analog | ANALOG | PAADEE |
| my_analog | ANALOG | PAADER |
| my_lvdsout_p | LVDS OUTPUT | LVDSOUTxEE |
| my_lydsout0_n | LVDS OUTPUT | LVDSOUTxEE |
| my_lvdsin_p | LVDS INPUT | LVDSINxEE |
| my_lydsin0_n | LVDS INPUT | LVDSINxEE |

We claim:

1. A design method for integrated circuits, comprising:
in a data structure referred to here as a "specification table", providing a configuration that relates defined signals to corresponding test-port pins of a test-port interface according to each of a plurality of defined test modes, wherein: (a) some but not all of the test-port pins are designated as address pins that are to be used to specify what test mode is to be enabled according to what signal values are applied to them, and (b) the different test modes have different configurations;
in a digital data-processing machine, responsive to the specification table, automatically analyzing pin requirements for the test-port interface, wherein said analysis includes determining port names for at least input signals, output signals, local signals, and output-enable signals;
in a digital data-processing machine, generating address-detect logic and test-enable logic, wherein: (a) said logic is combinational; and (b) said logic is adapted to respond to the signal values on the address pins by enabling at each given time only such test mode as corresponds to the values of those signals at that time;
in a digital data-processing machine, for at least some ports designated as output ports, generating multiplexer logic configured to allow only a single input at each given time, such that each said port can toggle between data signals and test signals; and
recording a representation in RTL code of at least a test-port interface for an integrated circuit, wherein: (a) the RTL code includes said address-detect logic, said test-enable logic, and said multiplexer logic, and (b) the RTL code logically defines all wires and ports required to implement the configurations specified in the specification table.

2. The method of claim 1, further comprising:
providing a pad table;
analyzing top-level pin requirements for the integrated circuit in response to input that comprises: (a) the pad table, and (b) test-port pin names, core stimulus signal names, and core observation signal names determined in the step of automatically analyzing pin requirements for the test-port interface; and
generating a top-level representation in RTL code of the integrated circuit including the test-port interface and further including a core block of the integrated circuit;
wherein the recorded representation comprises the generated top-level representation in RTL code.

3. The method of claim 1, wherein the test-port pins are reconfigurable among the input-output signal types "input", "output", "tristate", and "bidirectional".

4. The method of claim 1, wherein the defined test modes include "System Mode", "ATPG Test Mode", and "Memory Test Mode".

5. The method of claim 1, wherein:
each configuration specifies a plurality of internal signals that are to go from a test port to an integrated circuit core;
at least some of the internal signals are stimulus signals; and
each configuration further specifies a plurality of observation signals.

6. The method of claim 1, wherein:
each configuration specifies a plurality of internal signals that are to go from a test port to an integrated circuit core; and
the plurality of internal signals comprises a "Scan Mode" signal, a "Built-In Self-Test (BIST) Mode" signal, a "Scan Test Enable" signal, a "Scan Test Input" signal, an "Oscillator Enable" signal, and a "Power-Supply Monitor (PSM) Enable" signal.

7. A non-transitory, machine-readable medium containing a set of instructions for a computer to perform the method of claim 1.

8. A digital data processing machine comprising:
a memory area containing a stored set of instructions that configure the said machine to read a plurality of configurations from input comprising a data structure referred to here as a "specification table", wherein each of the configurations relates defined signals to corresponding test-port pins of a test-port interface according to each of a plurality of defined test modes, some but not all of the test-port pins are designated as address pins that are to be used to specify what test mode is to be enabled according to what signal values are applied to them, and the different test modes have different configurations;
a memory area containing a stored set of instructions that configure the said machine to respond to the specification table by automatically analyzing pin requirements for the test-port interface, wherein said analysis includes determining port names for at least input signals, output signals, local signals, and output-enable signals;
a memory area containing a stored set of instructions that configure the said machine to generate address-detect logic and test-enable logic, wherein said logic is combinational, and wherein said logic is adapted to respond to the signal values on the address pins by enabling at each given time only such test mode as corresponds to the values of those signals at that time;
a memory area containing a stored set of instructions that configure the said machine to generate multiplexer logic for at least some ports designated as output ports, wherein the multiplexer logic is configured to allow only a single input at each given time, such that each said port can toggle between data signals and test signals; and
a memory area containing a stored set of instructions that configure the said machine to record a representation in RTL code of at least a test-port interface for an integrated circuit, wherein: the RTL code includes said address-detect logic, said test-enable logic, and said multiplexer logic; and the RTL code logically defines all wires and ports required to implement the configurations specified in the specification table.

9. An integrated circuit, comprising:

a core that can be tested by stimulating it with stimulus signals and observing observation signals that are generated in response to the stimulus signals;

a circuit adapted to implement a plurality of distinct test-mode blocks, each of which is to be enabled for performance in a respective test mode;

a plurality of bidirectional test-port pins;

a multiplexer circuit adapted to enable the test-mode blocks to share a common group of the test-port pins for input and output and to merge the outputs of the respective test-mode blocks such that output from only one test-mode block at a time is enabled;

a circuit adapted to enable only one test-mode block at a time according to its respective test mode and to determine which test mode block is to be activated in response to signal values on a plurality of test-port pins that are designated as address pins; and a circuit adapted to configure the test-port pins in a respective configuration for each of the test modes;

wherein each test-mode block is adapted to monitor specified core observation signals and to drive specified core stimulus signals via at least some of the test-port pins; and wherein each configuration has a distinct mapping of functions to the test-port pins.

10. The integrated circuit of claim 9, wherein the test-port pins are re-mappable among the I/O signal types input, output, tristate, and bidirectional.

11. The integrated circuit of claim 9, wherein:

test-port inputs are broadcast to the test-mode blocks;

the respective test-mode blocks to the multiplexer circuit; and when they are enabled, the respective test-port outputs travel from the multiplexer circuit to designated test-port pins.

* * * * *